United States Patent [19]

Larson, III et al.

[11] 4,404,489

[45] Sep. 13, 1983

[54] ACOUSTIC TRANSDUCER WITH FLEXIBLE CIRCUIT BOARD TERMINALS

[75] Inventors: John D. Larson, III, Palo Alto, Calif.; David G. Miller, Andover, Mass.

[73] Assignee: Hewlett-Packard Company, Palo Alto, Calif.

[21] Appl. No.: 203,409

[22] Filed: Nov. 3, 1980

[51] Int. Cl.³ .......................................... H01L 41/22
[52] U.S. Cl. ................................. 310/334; 29/25.35; 29/832; 174/68.5; 310/363; 361/398
[58] Field of Search ............... 310/334, 335, 336, 363; 29/25.35, 832, 840, 854–856; 174/68.5, 117 FF; 339/17 F; 361/398

[56] References Cited

U.S. PATENT DOCUMENTS

| | | | |
|---|---|---|---|
| 3,579,206 | 5/1971 | Grange | 340/173.1 |
| 3,766,439 | 10/1973 | Isaacson | 317/100 |
| 3,818,415 | 6/1974 | Evans et al. | 339/17 F |
| 3,952,387 | 4/1976 | Iinuma et al. | 310/334 |
| 4,095,412 | 6/1978 | Burke | 58/50 R |
| 4,217,684 | 8/1980 | Brisken et al. | 29/25.35 |

Primary Examiner—J. D. Miller
Assistant Examiner—D. L. Rebsch
Attorney, Agent, or Firm—Edward Y. Wong

[57] ABSTRACT

A method is provided to connect individual conductive traces to an array of individual piezoelectric elements by bonding a flexible circuit board containing conductive traces to the piezoelectric elements. The resultant bonded elements provide an array for an acoustic transducer.

3 Claims, 5 Drawing Figures

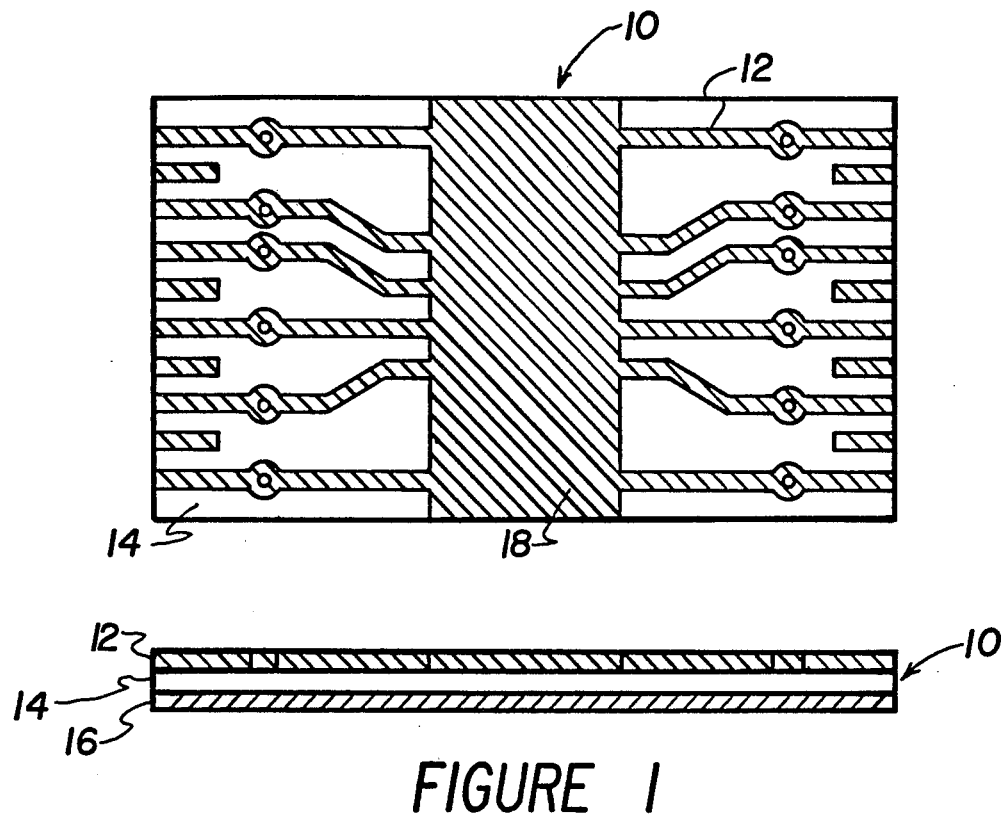
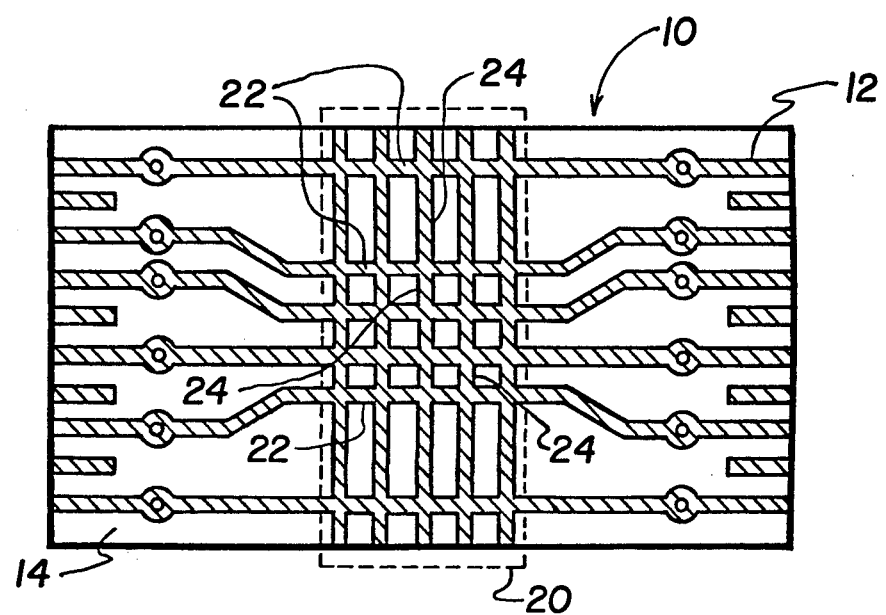
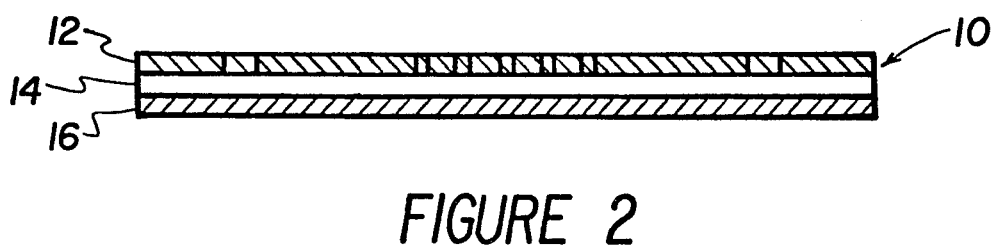

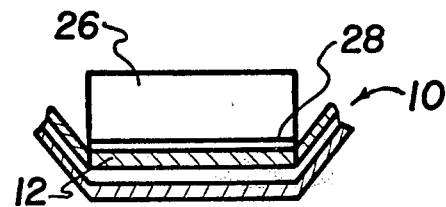
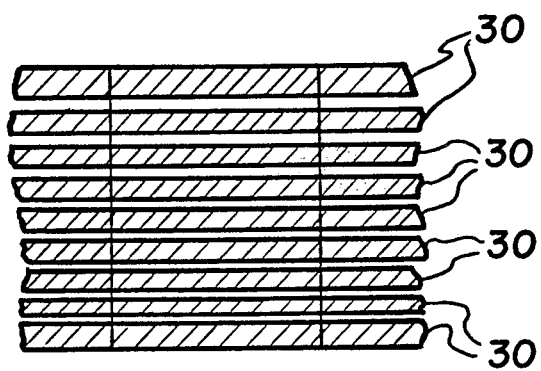
FIGURE 3
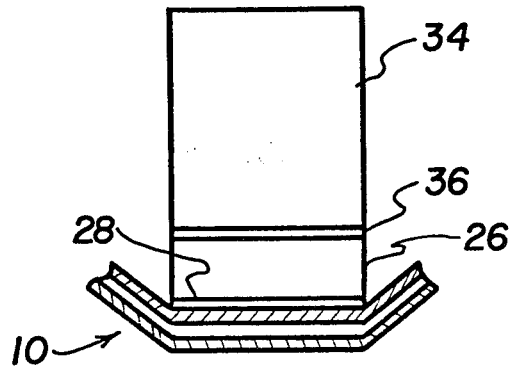
FIGURE 4
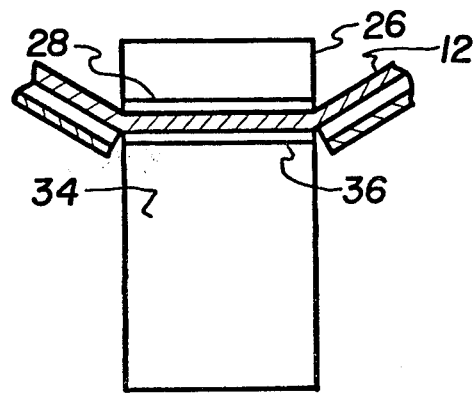
FIGURE 5

ACOUSTIC TRANSDUCER WITH FLEXIBLE CIRCUIT BOARD TERMINALS

BACKGROUND AND SUMMARY OF THE INVENTION

A typical acoustic transducer consists of an array of individual piezoelectric elements, each of which must be electrically connected separately to an electrically conductive connector for transmission and reception of electrical signals. To make the electrical connection in the prior art, one might bond individual connectors to the electrodes of the array elements. Thus, if the transducer consists of a large array of elements, this technique of providing electrical connections can prove time consuming and tedious.

Still another prior art technique of providing electrical connections to the array of elements individually is to solder fingers of conductive material onto a rigid circuit board initially. Then, the conductive fingers are individually connected to the electrodes of the elements with conducting epoxy. This technique likewise proves to be time consuming and tedious. Furthermore, because of the close proximity of the transducer elements, the conductive epoxy has to be applied extremely carefully. Otherwise, adjacent elements can easily be short-circuited to each other.

To overcome these disadvantages in the prior art techniques, the technique in accordance with the present invention bypasses the need for making individual connections to the array of transducer elements by bonding onto a block of piezoelectric material a flexible circuit board containing conductive traces of etched, individual connectors. The piezoelectric block may contain individual elements, in which case the individual connectors would be aligned with the individual elements before bonding. Once bonded, the connectors and elements form individual transducer elements. Alternatively, the piezoelectric block may be solid, in which case the flexible circuit board would be bonded to the block and both circuit board and block would be sawn to form individual transducer elements.

DESCRIPTION OF THE DRAWINGS

FIG. 1 shows the top and side views of a flexible circuit serving as electrical connectors.

FIG. 2 shows the top and side views of a flexible circuit with an etched patterned array of connectors.

FIG. 3 shows the flexible circuit of FIG. 1 or FIG. 2 attached to a block of piezoelectric material in accordance with the invention.

FIGS. 4 and 5 show alternate means of attaching a backing to a piezoelectric block with electrical connectors.

DETAILED DESCRIPTION OF THE INVENTION

In the preferred embodiment, a flexible circuit board 10 has a sandwich construction comprising a layer of conductive traces 12 like copper, a layer of insulator 14 like plastic, such as that available under the tradename "Kapton", and, possibly, a layer of ground shield 16.

The conductive traces can radiate from a solid conductive area 18 as shown in FIG. 1. Alternatively, it can radiate from a patterned conductive area 20 as shown in FIG. 2. Here, the pattern 20 consists of etched individual connectors 22 with spaces 24. The advantage of a patterned area 20 is that subsequent sawing or cutting of the flexible circuit board 10 is greatly facilitated and cleaner individual traces can be achieved than from a solid conductive area. Furthermore, burrs in the connectors resulting from the cutting process are minimized and delamination of the traces is lessened with a patterned area.

The solid or patterned conductive area to the layer of conductive traces 12 is directly attached to a block 26 of piezoelectric material with, for instance, a very thin epoxy bond 28. The block 26 of piezoelectric material may be a single solid piece, or it may comprise an array of individual elements. If the material is a single solid piece, the material is sawn through along with the flexible circuit after the bonding to form an array of individual transducer elements 30. Each of these elements 30, has an electrical connector 22 terminated on a piece of piezoelectric material 26. This forms a transducer element 30. On the other hand, if the block has been precut into individual piezoelectric elements, the pattern of conductive traces in the flexible circuit must be carefully aligned with the piezoelectric elements, and the individual traces must be individually bonded to a corresponding piezoelectric element. Great care must be exercised in the bonding to prevent short-circuiting of elements, especially adjacent ones.

A backing 34 can be attached either directly to the piezoelectric block 26 or to the conductive layer 12 of the flexible circuit, for instance, by bonding it with a thin layer of epoxy 36. The backing 34 serves to add rigidity to the array of elements. If the array is to serve as a phased-array acoustic transducer, the backing can also serve as an acoustic absorber to provide a unidirectional acoustic transmission.

We claim:

1. An apparatus for an acoustic transducer comprising:
   a flexible circuit board having a first layer of a plurality of conductive traces and a second layer of insulation;
   a piezoelectric block having a plurality of piezoelectric elements attached to a part of said circuit board first layer; and
   attachment means for directly attaching each of said plurality of piezoelectric elements to one of said plurality of conductive traces to form a plurality of individual transducer elements.

2. The apparatus as in claim 1 further comprising a backing attached to a portion of the first layer of said flexible circuit board on a surface opposite to the surface attached to said piezoelectric block.

3. The apparatus as in claim 1 further comprising a backing attached to said piezoelectric block on a surface opposite to the surface attached to said flexible circuit board.

* * * * *